(12) United States Patent
You et al.

(10) Patent No.: US 7,546,511 B2
(45) Date of Patent: Jun. 9, 2009

(54) ERROR DETECTION CODE GENERATING METHOD AND ERROR DETECTION CODE GENERATOR

(75) Inventors: Cheolwoo You, Seoul (KR); Young Jo Lee, Kunpo-shi (KR); Young Woo Yun, Seoul (KR); Suk Hyon Yoon, Seoul (KR); Soon yil Kwon, Kunpo-shi (KR); Ki-Jun Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 1264 days.

(21) Appl. No.: 10/307,416

(22) Filed: Dec. 2, 2002

(65) Prior Publication Data

US 2003/0103480 A1 Jun. 5, 2003

(30) Foreign Application Priority Data

Dec. 5, 2001 (KR) .......................... 10-2001-76756
Dec. 5, 2001 (KR) .......................... 10-2001-76757

(51) Int. Cl.
*H03M 13/00* (2006.01)
(52) U.S. Cl. ...................... 714/758; 370/335; 370/349
(58) Field of Classification Search ................ 714/776, 714/758; 379/399.02; 702/189; 370/335, 370/349
See application file for complete search history.

(56) References Cited

U.S. PATENT DOCUMENTS

| | | | | |
|---|---|---|---|---|
| 5,142,539 A | 8/1992 | Dahlin et al. | ............... | 371/37.1 |
| 5,323,403 A | 6/1994 | Elliott | .......................... | 371/37.6 |
| 5,390,197 A | 2/1995 | MacDonald et al. | ....... | 371/37.1 |
| 5,504,773 A | 4/1996 | Padovani et al. | ............. | 375/200 |
| 5,724,368 A | 3/1998 | Zook | .......................... | 371/37.7 |
| 5,754,734 A | 5/1998 | Emeott et al. | ............... | 395/2.35 |
| 6,201,811 B1 | 3/2001 | Larsson et al. | ............... | 370/395 |
| 6,275,517 B1 * | 8/2001 | Izumi | .......................... | 375/133 |
| 2002/0183020 A1 * | 12/2002 | Zhu et al. | .................... | 455/108 |

FOREIGN PATENT DOCUMENTS

| | | |
|---|---|---|
| EP | 0 276 991 A1 | 8/1988 |
| EP | 1 388 212 | 11/2002 |
| EP | 1317092 A2 | 6/2003 |
| GB | 2 387 303 A | 10/2003 |
| JP | 05-218883 | 8/1993 |
| JP | 10-233789 | 9/1998 |
| KR | 10-2001-0050946 A | 6/2001 |
| KR | 10-2003-0046307 A | 6/2003 |
| WO | WO 00/21210 A1 | 4/2000 |
| WO | WO 02/35761 A2 | 5/2002 |
| WO | WO 02/093296 A2 | 11/2002 |

OTHER PUBLICATIONS

InterDigital; "Updated Recommendation for UE-Specific CRC"; TSG-RAN Working Group 1 Ad Hoc; R1-011066; Sophia Antipolis, France; Nov. 5-7, 2001.
European Examination Report dated Mar. 10, 2006.
Korean Office Action dated Mar. 20, 2008.
Canadian Office Action dated May 1, 2008.
Foreign Office Action.

* cited by examiner

*Primary Examiner*—Guy J Lamarre
(74) *Attorney, Agent, or Firm*—Ked & Associates, LLP

(57) ABSTRACT

In a mobile communication system, an error detection code or a quality frame indicator (e.g., CRC) is generated using selectively frame information, and at least one of a WCA identifier of another terminal, and a corresponding terminal identifier. And the terminal identifier can be implicitly transmitted to the receiver.

4 Claims, 10 Drawing Sheets

FIG. 1
Background Art

| information bit field of PDCCH | Number of Bits |
|---|---|
| Encoder packet size (EP_SIZE) | 3 |
| ARQ channel identifier(ACID) | 2 |
| subpacket identifier(SPID) | 2 |
| MAC identifier (MAC_ID) | 6 |
| | Total Number of Bits=13 bits |

FIG. 2

| Field | Number of Bits |
|---|---|
| MAC_ID | 8 |
| WALSH_MASK | 0 or 13 |
| EP_SIZE | 0 or 3 |
| ACID | 0 or 2 |
| SPID | 0 or 2 |
| AI_SN | 0 or 1 |
| WCA (e.g; LWCI/CWSI) | 0 or X_i (e.g; 5) |
| EXT_MSG_TYPE | 0 or 2 |
| RESERVED | 0 or 8 |

| information field of PDCCH(i) | Number of Bits |
|---|---|
| Encoder packet size (EP_SIZE) | 0 or 3 |
| ARQ channel identifier(ACID) | 0 or 2 |
| subpacket identifier(SPID) | 0 or 2 |
| Walsh Code Allocation(WCA, e.g.,LWCI or CWSI) | 0 or 5 |
| ARQ Identifier Sequence Number field (AI_SN) | 0 or 1 |
|  | Total Number of Bits=0 or 13 bits |

ERROR DETECTION CODE GENERATING METHOD AND ERROR DETECTION CODE GENERATOR

This application claims the benefit of the Korean Application Nos. P2001-76756 and P2001-76757 filed on Dec. 5, 2001 and this application is related to U.S. application Ser. No. 10/259,292 filed Sep. 30, 2002, whose entire disclosure hereby is incorporated herein by reference.

BACKGROUND OF THE INVENTION

1. Field of the Invention

The present invention relates to a communication system, and more particularly, to an error detection code generating method and an error detection code generator in a mobile communication system.

2. Background of the Related Art

Typically, radio communication systems for transferring packet data use physical channels, such as, Packet Data Channel (hereinafter referred to as PDCH), Packet Data Control Channel (hereinafter referred to as PDCCH) and so forth.

The PDCH is a channel for use of transferring packet data that actually needs to be transferred to a relevant terminal, mobile station or user (hereinafter being used interchangeably). Many users prefer the PDCH based on the Time Division Multiplexing system (hereinafter referred to as TDM system). The PDCCH contains control information, enabling a terminal to receive the data being transferred through the PDCH without error.

FIG. 1 illustrates a control message format and a number of information bits transmitted through PDCCH according to a related art for a TDM system. The ARQ (automatic request) channel identifier and subpacket identifier are binary information bits informing the terminal of whether information including PDCH corresponding to PDCCH is to be retransmitted or not. The encoder packet size is binary information bits informing a data information bit number transmitted on PDCH. The MAC identifier is a terminal identifier, and values except $(000000)_2$ indicate that control information of PDCCH is transferred to which terminal.

When a base station transfers packet data using TDM system, or schedules data and later sending the data to each terminal in sequence, the packet data, which is transmitted to every terminal, always uses all of the available resources, e.g., Walsh codes, in the PDCH. Even when only a part of the available resources needs to be used, all of the resources are still used for the packet data. As a result thereof, most of other resources are wasted at the same time.

For example, data sent on PDCH need to be coded and decoded based on Walsh codes. Serial bits are converted to parallel, and the parallel bits are coded using the Walsh codes. In order to decode the data, the information regarding the Walsh codes is sent on the PDCCH.

In TDM system, there are plurality of time intervals 1, 2, 3, 4, 5, 6, etc, and only one of a plurality of terminals is allotted for each time interval where a PDCH and PDCCH are sent to the terminal during this allotted time interval. For example, if there are users 1 and 3 and time intervals 1 and 3, respectively, and if all 32-ary Walsh codes are available for use by terminal 1, all 32-ary Walsh codes are utilized in the PDCH during time interval 1. However, if the available Walsh codes decrease in time interval 3, all decreased Walsh codes are utilized for the PDCH. Even before terminal 3 can use the changed/decreased Walsh codes in time interval 3, it needs to know this information. In order to achieve this, the BS broadcasts such information using a Walsh Code Space Identification Identifier (WSI) field in the PDCCH (without PDCH) with MAC_ID field information bit of $(000000)_2$ before time interval 3 to all terminals within a cell. And, the base station explicitly transmits a control message including MAC_ID to the terminals on PDCCH.

A base station regularly or irregularly broadcasts WSI on the PDCCH without the PDCH to all terminals under its management. In the course of the broadcast, the base station uses every possible power for all terminals (even including terminals in the worst environment) to be able to receive the information such that even the terminals in the worst environment can receive the WSI. Hence, the broadcasting consumes much power. Moreover, when the WSI change, the base station has to inform the changes to all terminals every time. In those cases, the base station cannot transmit PDCH, so the transmission efficiency of the entire system is consequently reduced.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a modified control message format.

Another object of the present invention is to provide an additional field for the control message format and reduce the number of bits of the control message format.

A further object of the invention is to improve the error detection capability of the PDCCH.

Another object of the present invention is to provide an error detection code generating method and an error detection code generator enabling to increase a use efficiency of resources and improve an error detection capability.

A further another object of the present invention is to transmit an MAC_ID Implicitly.

To achieve at least these and other advantages in whole or in part, there is provided in a mobile communication system using time division multiplexing and code division multiplexing, an error detection code generating method according to the present invention is characterized in that an error detection code is generated using selectively a control information for data transmission, a Walsh space indication identifier of another terminal, and a corresponding terminal identifier.

To further achieve at least these and other advantages in whole or in part, there is provided a method that includes generating a first error detection code using the control information for the data transmission and the Walsh space indication identifier of another terminal and generating a second error detection code using the first error detection code and the terminal identifier.

Preferably, wherein 0 or 1 bits are padded on the terminal identifier so that a length of the terminal identifier coincides with that of the first error detection code.

Preferably, the Walsh space indication identifier of another terminal and terminals identifier are not transmitted to a terminal to which the data will be transmitted.

Preferably, the step of generating the second error detection code further includes a step of carrying out an exclusive or operation on the first error detection code and corresponding terminal identifier.

Preferably, the method further includes adding the second error detection code to the control information for the data transmission.

Preferably, the method includes initializing an error detection code generator using the terminal identifier and generating an error detection code from the initialized error detection code generator using the control information for the data transmission.

Preferably, the method includes initializing an error detection code generator using the terminal identifier and generating an error detection code from the initialized error detection code generator using the control information for the data transmission and the Walsh space indication identifier of another terminal.

Preferably, the method includes initializing an error detection code generator using the terminal identifier and Walsh space indication identifier of another terminal and generating an error detection code from the initialized error detection code generator using the control information for the data transmission.

Preferably, the control information for the data transmission includes an identifier of a retransmission channel used for retransmission, a subpacket identifier in the retransmission channel, a data size of a channel through which the data are transmitted, and a Walsh space indication identifier of a corresponding terminal.

To further achieve at least these and other advantages in whole or in part and in accordance with the purpose of the present invention, as embodied and broadly described herein, there is provided in a mobile communication system using time division multiplexing and code division multiplexing, an apparatus for generating an error detection code is characterized in that an error detection code is generated using selectively a control information for data transmission, a Walsh space indication identifier of another terminal, and a corresponding terminal identifier.

Preferably, the apparatus includes an error detection code generator generating a first error detection code using the control information for the data transmission and the Walsh space indication identifier of another terminal and a modulo operator generating a second error detection code using the first error detection code and the terminal identifier.

Preferably, the error detection code generator adds the second error detection code to the control information for the data transmission so as to transmit.

Preferably, the apparatus is initialized by the terminal identifier and generates an error detection code using the control information for the data transmission.

Preferably, the apparatus is initialized by the terminal identifier and generates an error detection code using the control information for the data transmission and the Walsh space indication identifier of another terminal.

Preferably, the apparatus is initialized by the terminal identifier and Walsh space indication identifier of another terminal and generates an error detection code using the control information for the data transmission.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 illustrates a message format of the background art;

FIG. 2 illustrates a message format in accordance with a preferred embodiment;

DETAILED DESCRIPTION OF PREFERRED EMBODIMENTS

Figures 3, 4:
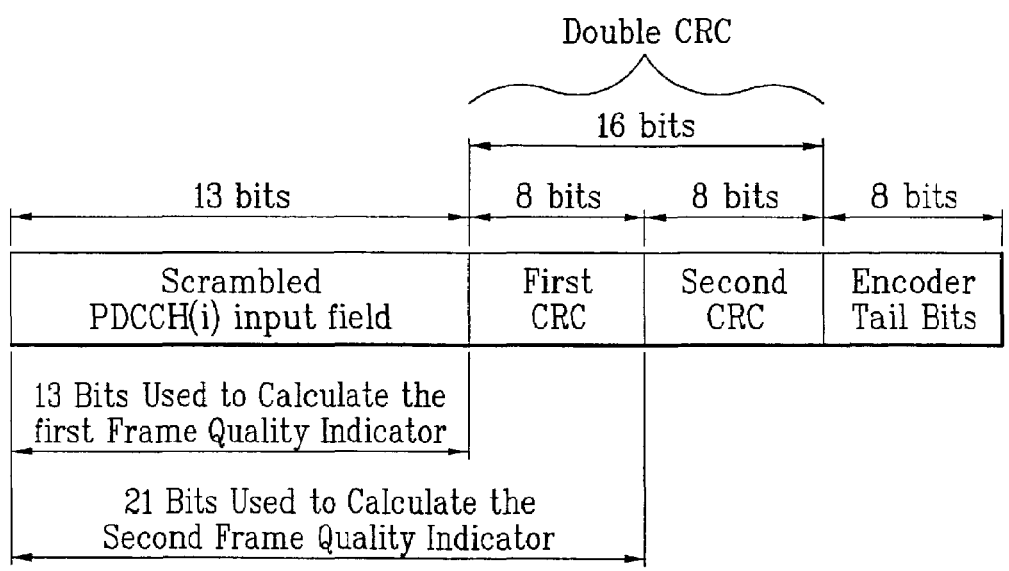
FIG. 3 illustrates a message format in accordance with a preferred embodiment.
FIG. 4 illustrates a frame structure in accordance with a preferred embodiment.

Prior to the description of the present invention, parameters used in the present invention are explained as follows.

Walsh code is a common name of codes having orthogonality to each other and used for transmitting physical channels.

Walsh code space is a set of Walsh codes available for the current use when a base station transmits packet data, and elements thereof vary in accordance with time.

PDCH(i) means $i^{th}$ PDCH if at least two PDCHs are available for use. In this case, each of PDCHs divides to use Walsh codes in Walsh code space.

PDCCH(i), if it is possible for at least two PDCHs to exist, is a common name of a physical channel including control information that a base station transmits to terminals in order to receive PDCH(i) successfully.

The present invention related to a packet data transmission system of a TDM/CDM system, whereby a plurality of PDCHs and PDCCHs exist. Hence, expressions of PDCH(i) and PDCCH(i) are used in the following description. In other words, when PDCCH(1), PDCCH(2), . . . , PDCCH(N) and PDCH(1), PDCH(2), . . . , PDCH(N) exists, PDCCH(i) indicates PDCCH that the base station transmits to the terminal to receive PDCH(i) successfully.

FIG. 2 illustrates the format of the Packet Data Control Channel (PDCCH) Message in accordance with the preferred embodiment (described hereinafter), over the PDCCH, e.g., forward PDCCH (F-PDCCH). The message format of the PDCCH includes an additional field called Walsh Code Allocation (WCA) field (e.g., CDM Walsh space Identification (CWSI) field/(Last Walsh Code Index (LWSI) field), which preferably prevents wasted power consumption caused by broadcasting, and eliminates such broadcast. Even if broadcasting is used, the additional field of WCA field reduces the inefficiencies of a prescribed system. The description of the fields illustrated in FIG. 2 and the various implementation of the WCA field can be found in co-pending U.S. application Ser. No. 10/259,292 filed Sep. 30, 2002, whose entire disclosure is incorporated herein by reference.

This message format can be used in both a TDM system, i.e., one PDCH physical channel and one PDCCH physical channel within a prescribed time interval and uses the available Walsh codes, and a Code Division Multiplex (CDM) system, i.e., a plurality of PDCH(i) physical channels and a plurality of PDCCH(i) physical channels, where i is an integer number that is greater than or equal to 0, within a prescribed period of time and the plurality of users are assigned to a plurality of physical channels by allocation of the Walsh codes within the Walsh code space.

In comparing the fields (EP_SIZE, ACID, SPID, MAC_ID, and WCA) of FIG. 1 (EP_SIZE, ACID, SPID, and MAC_ID) and FIG. 2 (EP_SIZE, ACID, SPID, MAC_ID, and WCA), the number of information bits has increased from 13 bits to 20 bits. With the addition of the WCA field, the number of bits for the PDCCH in TDM/CDM mode increased, resulting in more power consumption. Hence, there is a need to decrease the number of information bits of the PDCCH fields.

Three following approaches may be used for reducing the number of information bits of the PDCCH:

Method 1 is to use explicit 8 bits MAC_ID and add 8 bits CRC (cyclic redundancy check code), which is a class of linear error detecting codes which generate parity check bits by finding the remainder of a polynomial division, for error detection.

Method 2 is to mask the 16 bits CRC with the implicit user MAC_ID and not to transmit the MAC_ID.

Method 3 is to use a 'double CRC', wherein a first CRC is masked by 8 bit implicit MAC_ID and a second CRC is added with the first CRC and the MAC_ID is not transmitted.

The advantage of method 1 is that the maximum number of blind decodings of the forward PDCCH (F-PDCCH) is limited to 4, while method 2 requires a maximum of 6 blind decodings of F-PDCCH. Therefore, method 1 may be a preferred solution in terms of mobile complexity. The advantage of method 2 is that the UDER (UnDetected Error Ratio) performance is better than method 1 due to the increased CRC length.

Method 3 is a hybrid of method 1 and method 2. if two PDCCHs are supported by a system and the PDCCHs have three types of transmission format, Method 3 will provide approximately the same UDER performance as method 2, while maintaining the same level of mobile station complexity. Since the complexity of method 1 and method 3 is similar, it is reasonable to choose a method that provides better performance. Hence, the preferred embodiment of the present invention utilizes method 3 for reducing the number of bits of the PDCCH.

In accordance with a preferred embodiment, which uses the third method, FIG. 3 illustrates the message format of PDCCH when the number of bits of WALSH_MASK, EXT_MSG_TYPE and RESERVED fields equals 0 (see co-pending U.S. application Ser. No. 10/259,292). As shown therein, the number of bits of the PDCCH is decreased to 13 bits, even with the additional sequence number field bits.

The PDCCH frame structure is shown in FIG. 4 including the encoder tail bits of 8 bits. Further, the number of bits can be further reduced by decreasing the number of bits of the second CRC to be less than 8 bits, e.g., 4 bits, depending upon the system requirements. In order to generate the PDCCH frame structure, the following steps are used:

Step 1: First CRC bits are calculated based on the 13 input bits of the scrambled PDCCH and masked by the implicit 'MAC_ID'; and Step 2: Second CRC bits are calculated based on the 13 input bits and the first CRC bits generated in step 1.

Step 3: Encoder Tail bits are added.

Figure 5A:
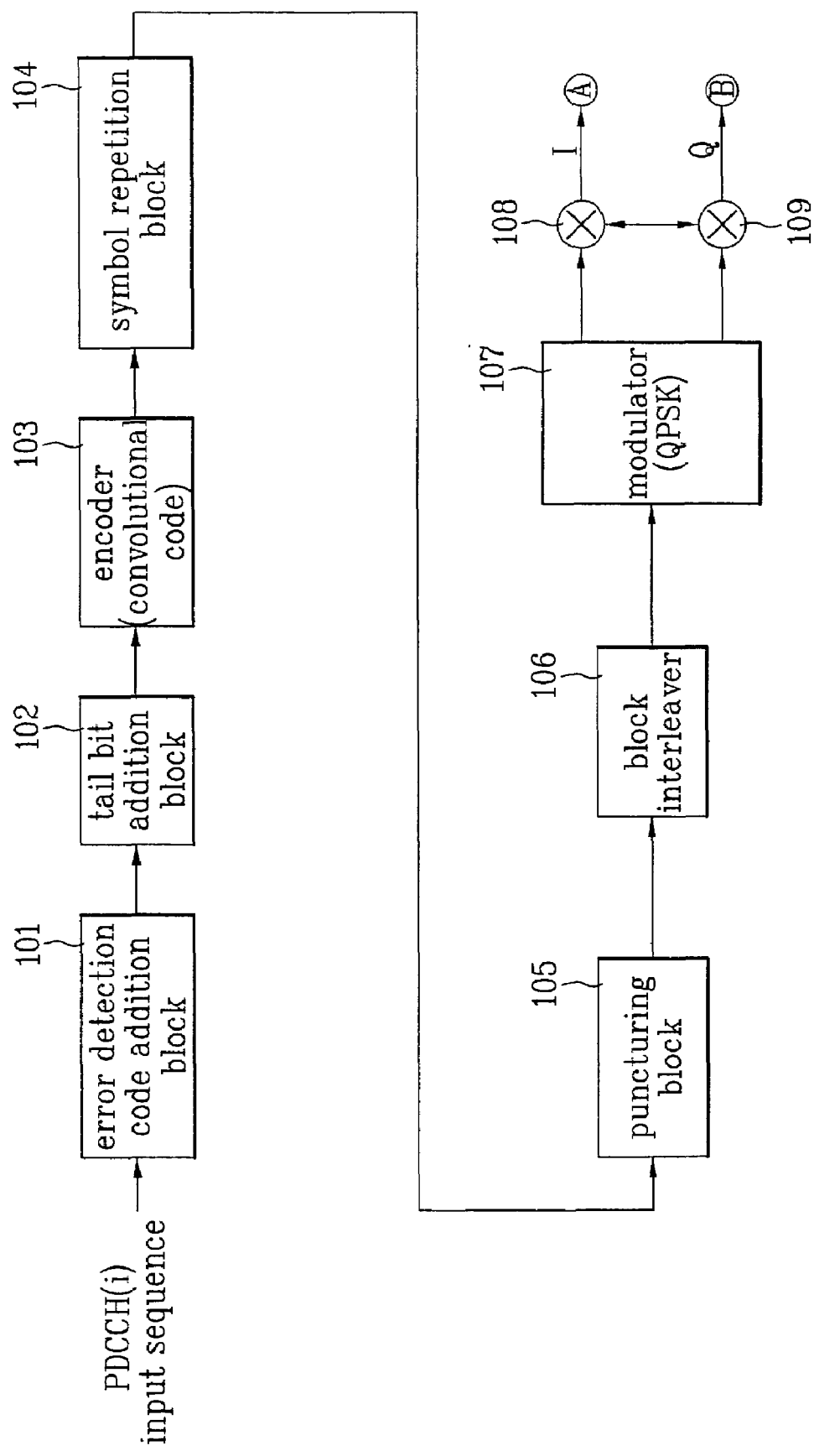
FIG. 5A illustrates a block diagram of a transmission chain structure of PDCCH in accordance with a preferred embodiment.

Depending upon the terminology used, the first CRC may be referred to as the outer CRC and the second CRC may be referred to as the inner CRC. Alternatively, the first CRC may be referred to as the inner CRC and the second CRC may be referred to as the outer CRC depending upon the terminology used. For convenience, the former will be used hereinafter in this preferred embodiment. FIG. 5A illustrates a general block diagram of a transmission chain structure of PDCCH in accordance with a preferred embodiment. Referring to FIG. 5A, an input sequence of PDCCH, as shown in FIG. 3, includes an ARQ channel identifier field of 2 bits, an encoder packet size field of 3 bits, and a subpacket identifier field of 2 bits, WCA field of 5 bits and optional sequence number field of 1 bit. An error detection code such as a CRC (cyclic redundancy check code) is added to the input sequence in an error detection code addition block 101.

Tail bits for sending a final state of a trellis termination are added to an output sequence of the error detection code addition block 101 in a tail bit addition block 102. The sequence to which the tail bits are added are encoded as a convolution code in an encoder 103. After the outputted sequence having been encoded, it is repeated in a symbol repetition block 104. The repeated bits are punctured in a puncturing block 105 and thereafter, is interleaved in a block interleaver 106, and then modulated in a QPSK modulator 107.

Figure 5B:
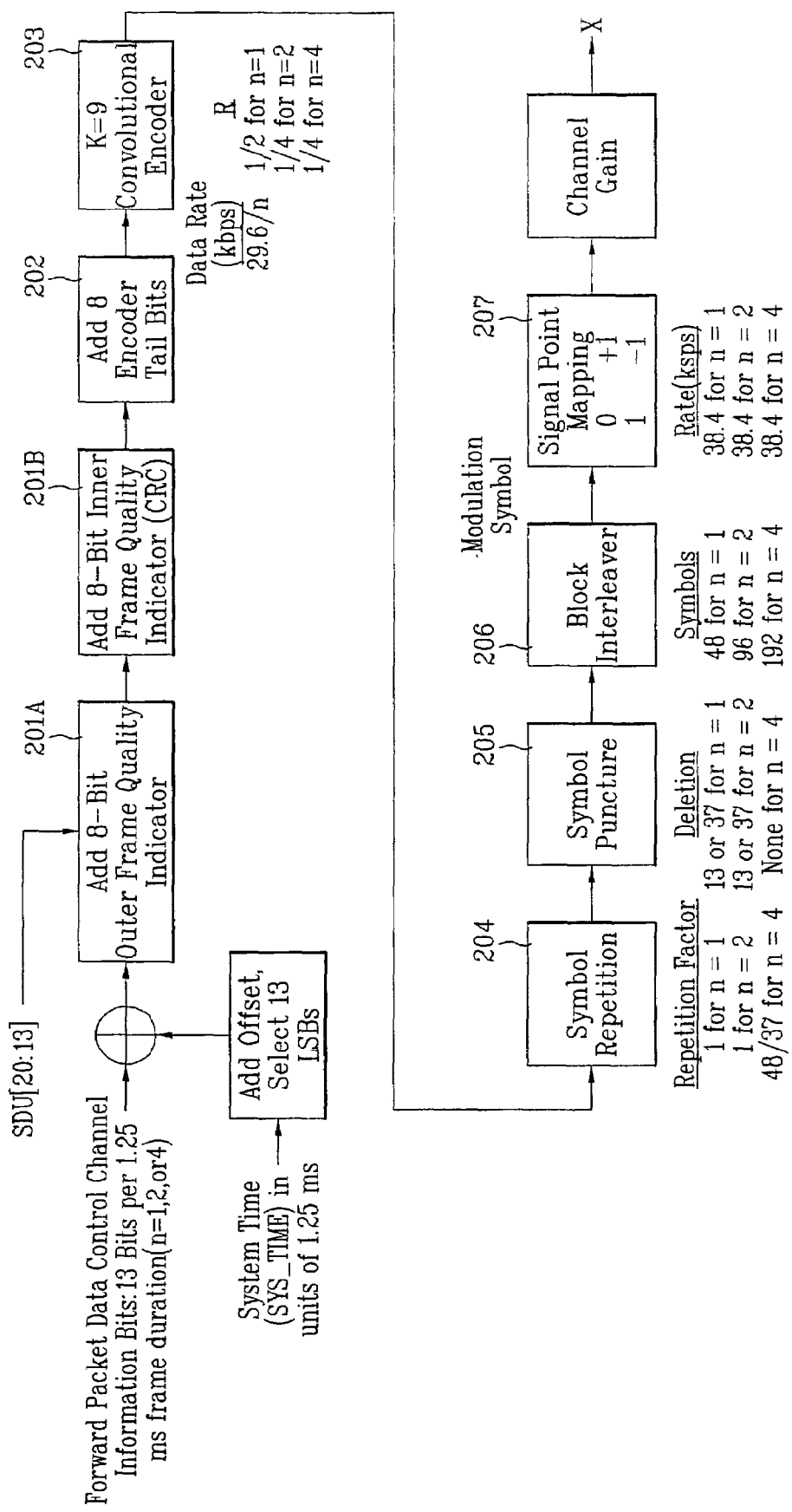
FIG. 5B illustrates a block diagram of a PDCCH transmission structure in accordance with a preferred embodiment.

FIG. 5B illustrates a detailed PDCCH transmission chain structure in accordance with a preferred embodiment of the present invention. In this case, the base station preferably transmit on the Forward Packet Data Control Channel at prescribed variable data rates, e.g., of 29600, 14800, and 7400 bps, depending on the frame duration. The frame duration is preferably NUM_SLOTS (NUM_SLOTS=1, 2, or 4) 1.25-ms slots. All Packet Data Control Channels and Packet Data Channels transmitted simultaneously preferably start their transmissions at the same time (SYS_TIME) and have the same durations.

For a given base station, the I and Q pilot PN sequences for the Forward Packet Data Control Channel preferably use the same pilot PN sequence offset as for the Forward Pilot Channel. The modulation symbols transmitted on the first Forward Packet Data Control Channel (PDCCH_ID='0') should preferably be transmitted using at least as much energy as the modulation symbols transmitted on the second Forward Packet Data Control Channel (PDCCH_ID='1') that is being transmitted simultaneously, Nmax_PDCH is 2. See co-pending application Ser. No. 10/259,292.

The information transmitted on the Forward Packet Data Control Channel preferably comprises scrambled SDU[12:0] and the frame quality indicator-covered SDU[20:13], where SDU (Service Data Unit) is a parameter passed by the MAC Layer. The Forward Packet Data Control Channel frame preferably comprises scrambled SDU[12:0], the 8-bit frame quality indicator-covered SDU[20:13], the 8-bit inner frame quality indicator (CRC), and the eight Encoder Tail Bits.

First CRC generator 201A and Second CRC generator 201B: The 8-bit frame quality indicator-covered SDU[20:13] (first CRC) is generated by performing the modulo-2 addition of the SDU[20:13] (MAC_ID) passed by the MAC Layer, with an outer frame quality indicator, which is calculated on the scrambled SDU[12:0]. Second CRC generator 201B: The inner frame quality indicator (second CRC) is calculated on all bits within the frame, except the inner frame quality indicator itself and the encoder tail bits.

The tail bit generator (202) generates the last eight bits of each Forward Packet Data Control Channel frame are called the Encoder Tail Bits. Preferably, each of the eight bits is set to '0'. The encoder (203) convolutionally encodes as the PDCCH frame. Preferably, the encoder is initialized to the all-zero state at the end of each frame. The encoded PDCCH frame undergoes code symbol repetition (204) and the code symbols resulting from the symbol repetition are punctured (205). The modulation symbols on the PDCCH are then interleaved, and the interleaver block (206) is aligned with the PDCCH frame.

Figure 6A:
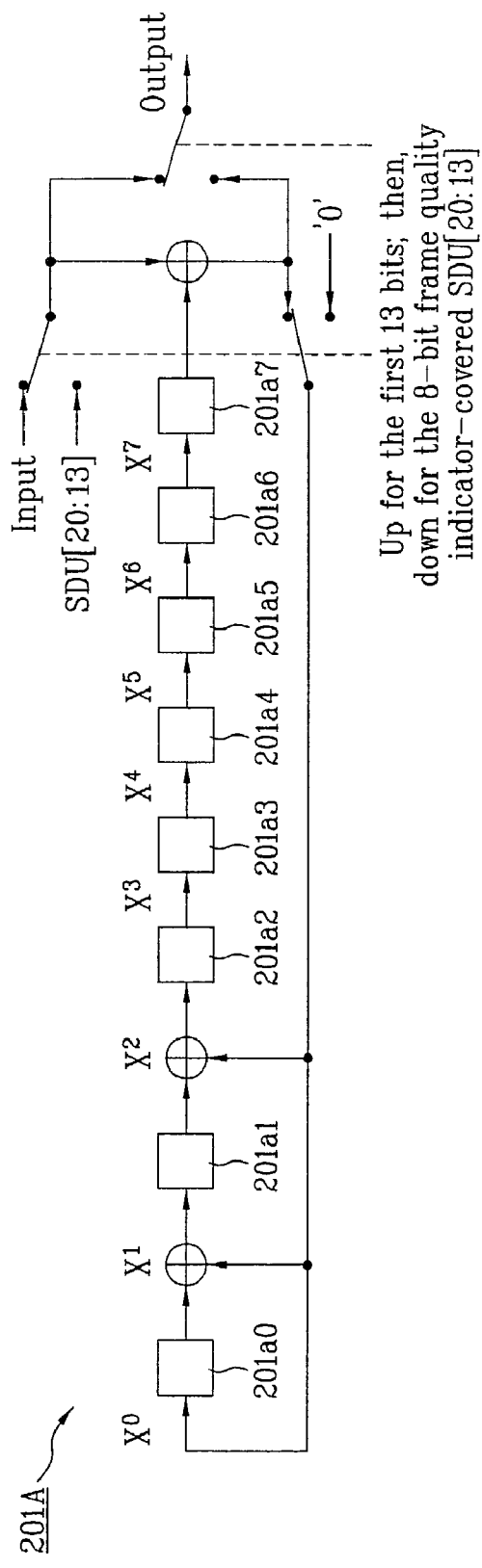
FIG. 6A illustrates a block diagram of the outer quality frame quality indicator of FIG. 5B in accordance with a preferred embodiment.

The modulation symbol is provided to the signal point mapping block 207 (e.g., modulator) for transmission. FIG. 6A illustrates details of the first (outer) CRC generator 201A of FIG. 5. The 8-bit frame quality indicator-covered SDU[20: 13] (first CRC) is generated by performing the modulo-2 addition of the SDU[20:13] (MAC_ID). passed by the MAC Layer with an outer frame quality indicator, which is calculated on the scrambled SDU[12:0]. The generator polynomial for the outer frame quality indicator is based on $g(x)=x8+x2+x+1$.

Initially, all shift register elements 201a0-201a7 is preferably set to a logical one and the switches are preferably set in the up position. The register are clocked once for each of the first 13 scrambled input bits of the Forward Packet Data Control Channel frame with those bits as input. Then, the switches are set in the down position so that the output is a modulo-2 addition with the 8-bit SDU[20:13] and the successive shift register inputs are '0's. Each register is clocked an additional eight times. These additional bits form the frame quality indicator-covered SDU[20:13] field, i.e., the outer CRC, which are transmitted in the order calculated as output.

Figure 6B:
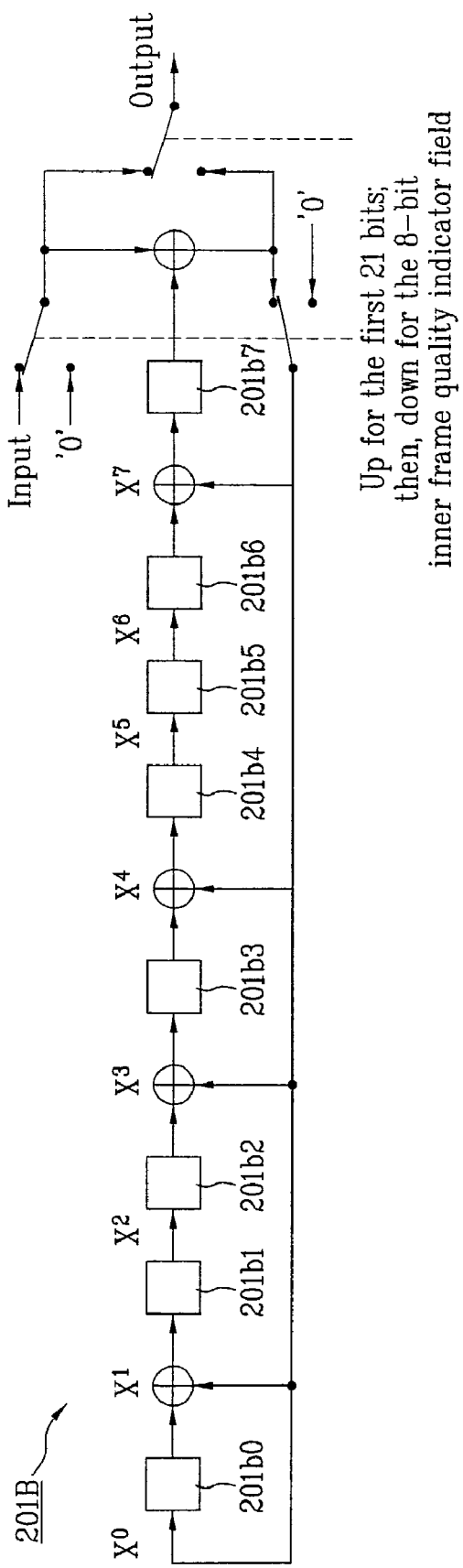
FIG. 6B illustrates an inner frame quality indicator of FIG. 5B in accordance with a preferred embodiment.

FIG. 6B illustrates the details of the second (inner) CRC generator 201B illustrated in FIG. 5. The inner frame quality indicator (CRC) is generated based on all bits within the frame, except the inner frame quality indicator itself and the Encoder Tail Bits. The Forward Packet Data Control Channel preferably uses an 8-bit frame quality indicator. The generator polynomial for the inner frame quality indicator is preferably based on $g(x)=x8+x7+x4+x3+x+1$.

Herein, the inner frame quality indicator and the outer frame quality indicator may be generated by different polynomials, respectively.

Initially, if the frame duration of the Forward Packet Data Control Channel is 1.25 or 2.5 ms, all shift register elements 201b0-201b7 are preferably initialized to logical one and the switches are preferably set in the up position. If the frame duration of the Forward Packet Data Control Channel is 5 ms, all shift register elements are preferably initialized to logical zero and the switches are preferably set in the up position. Each register is clocked once for each of the first 21 bits of the Forward Packet Data Control Channel frame with those bits as input. The switches are set in the down position so that the output is a modulo-2 addition with a '0' and the successive shift register inputs are '0's. The register is clocked an additional eight times. These additional bits shall be the inner frame quality indicator bits, which are transmitted in the order calculated as output.

Figure 7:
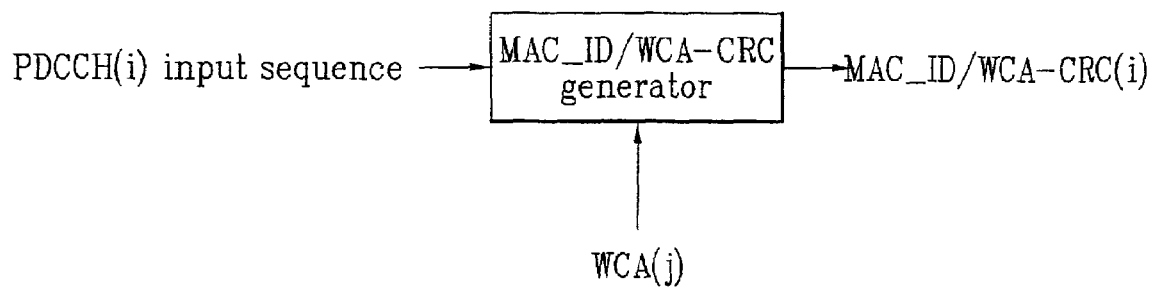
FIG. 7 illustrates a block diagram of an error detection code addition block in accordance with a preferred embodiment.

FIG. 7 illustrates a block diagram of an error detection code addition block of FIG. 5A in accordance with another preferred embodiment. In FIG. 7, the error detection code addition block is called a MAC_ID/WCA-CRC generator and an error detection code generated from the MAC_ID/WCA-CRC generator is called a MAC_ID/WCA-CRC code, where WCA is e.g., CWSI or LWCI. The symbol "/" is generally interpreted as "and" or "or." If "/" is interpreted as an "or," either the MAC_ID or WCA can be used. If "/" is interpreted as an "and," both MAC_ID and WCA are used. Referring to FIG. 7, an error detection code added to PDCCH(i) according to this preferred embodiment of the present invention, e.g. a MAC_ID/WCA-CRC code, is generated using the input sequence of PDCCH(i) input sequence with WCA(j) and-or MAC identifier (i) (MAC_ID(i)). Selectively, the MAC_ID/WCA-CRC code can be generated using the PDCCH(i) sequence and WCA(j) of another control channel PDCCH(j). In this case, WCA(j) means WCA transmitted on PDCCH(j), where ij and preferably j=i−1 when i>1. The MAC identifier (i) is allocated to a terminal or user which is to receive the information on PDCCH(i).

Figure 8:
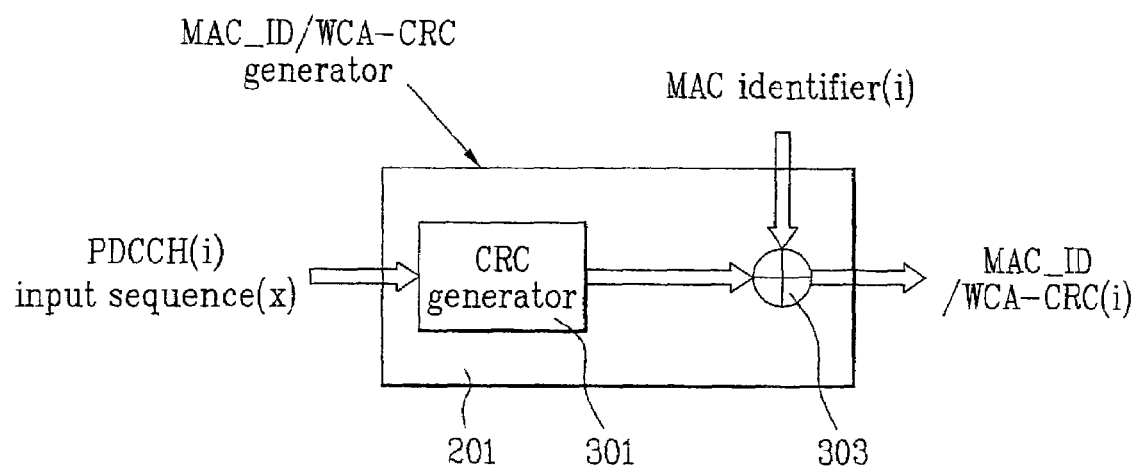
FIG. 8 and FIG. 9 illustrate block diagrams of an error detection code addition block in accordance with a preferred embodiment.

FIG. 8 illustrates a more detailed block diagram of the error detection code addition block illustrated in FIG. 7 in accordance with this preferred embodiment. A MAC_ID/WCA-CRC generator 201 according to the present invention includes a CRC generator 301 generating a general CRC code and a modulo operator 303.

In this instance, the CRC generator 301 uses PDCCH(i) input sequence (EP_SIZE, ACID, SPID, WCA(i) and AI_SN) of x bits and WCA(j) as inputs so as to generate a CRC code having a general M-bits length. The CRC generator 102 is a common name of the CRC generator constituted with transition registers.

The modulo operator 303 carries out a modulo-2 operation (e.g., exclusive OR operation) on the general CRC code of M-bits length and an MAC identifier(i) of S-bits length so as to generate a MAC_ID/WCA-CRC code of M bits. In this case, if S<M, the remaining bits (M-S) are padded with '0's or '1's in front or rear of the MAC identifier(i) and the modulo-2 operation is then carried out.

In FIG. 8, WCA(j) and MAC_ID(i) are selectively used to generate the MAC_ID/WCA-CRC code. That is, MAC_ID/WCA-CRC generator uses both or either of them.

Figure 9:
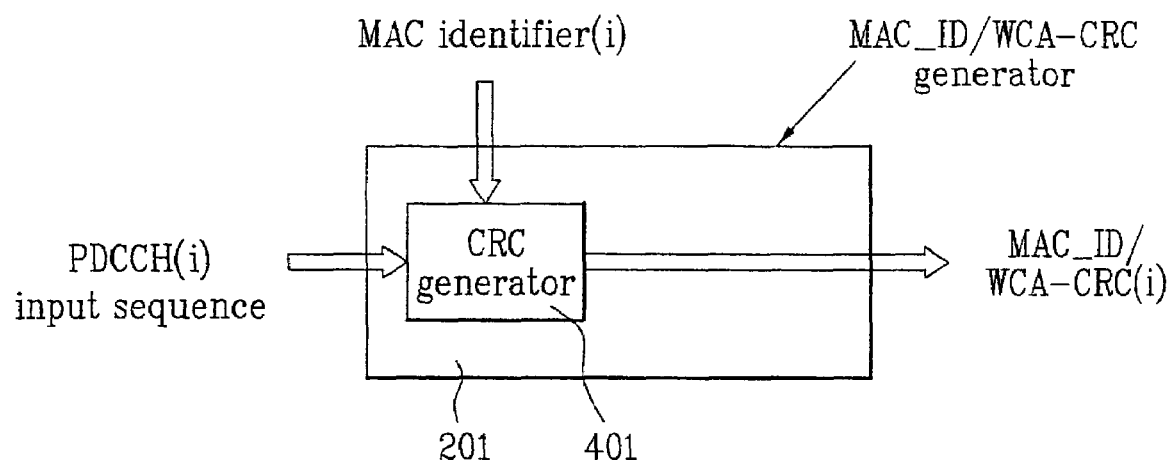

FIG. 9 illustrates a more detailed block diagram of the error detection code addition block illustrated in FIG. 7 in accordance with another preferred embodiment. Referring to FIG. 9, a CRC generator 401 included in a MAC_ID/WCA-CRC generator initializes values of its transition registers using the MAC_ID(i). If a length of the MAC identifier(i) is shorter than that for initializing the values of the transition registers of the CRC generator 401, '0's or '1's amounting to the necessary number are padded in front or rear of the MAC identifier(i) and a modulo 2 operation is carried out. The CRC generator 401 having the initialized transition registers based on MAC_ID(i) uses an PDCCH(i) input sequence of x-bits number and WCA(j) of PDCCH(j) so as to generate a MAC_ID/WCA-CRC(i) code having an M-bit length. In FIG. 9, WCA(j) and MAC_ID(i) are alternatively used to generate the MAC_ID/WCA-CRC code. That is, MAC_ID/WCA-CRC generator uses both or either of them.

Figure 10:
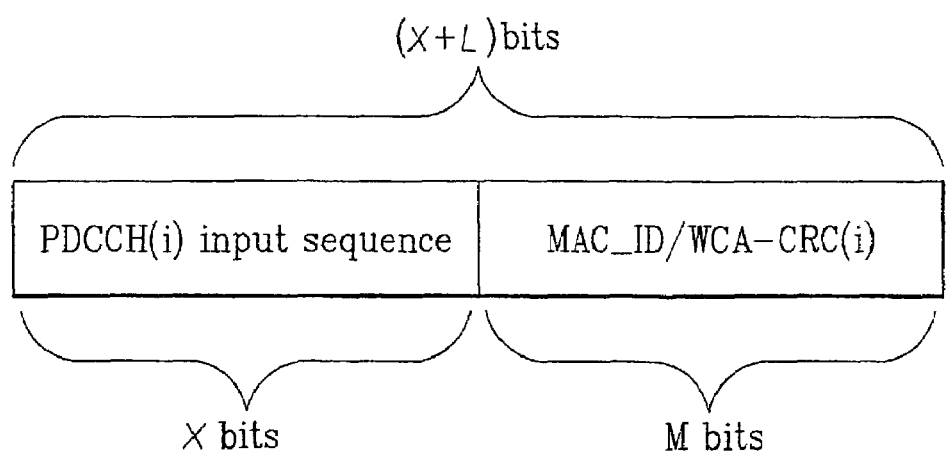
FIG. 10 illustrates a diagram of an output result of the error detection code addition block shown in FIG. 8 or FIG. 9 in accordance with a preferred embodiment.

FIG. 10 illustrates a diagram of an output result of each of the error detection code addition blocks of FIGS. 8 and 9. The MAC_ID/WCA-CRC(i) code is added to the PDDCH(i) input sequence for input to the tail bit addition block 102 of FIG. 5A. As can be appreciated, the arrangement order of the MAC_ID/WCA-CRC(i) code and PDCCH(i) input sequence can be reversed. The MAC identifier(i) is used for generating MAC_ID/WCA-CRC(i) and need not be transmitted separately to a receiving end when WCA(j) is not used ("/"=or). Likewise, when the MAC identifier(i) and WCA(j) are both used ("/"=and), these parameters need not be transmitted separately to the receiving end. Instead, the MAC_ID/WCA-CRC(i) and PDCCH(i) input sequence are transmitted to the receiving end.

If only the MAC_ID(i) is used for generating the MAC_ID/WCA-CRC code, (i.e., without WCA(j), there are no special considerations/factor that need to be taken into account. However, if the WCA(j) is used with or without MAC_ID(j) by the MAC_ID/WCA-CRC generator, the following operational factors should be considered.

First Operational Consideration

When N number of PDCH(i)s and N number of PDCCH (i)s are used, a terminal should recognize MAC identifier(i) and WCA(j) in order to receive PDCCH(i). Hence, in order to receive PDCCH(i), PDCCH(j) needs to be correctly received in order to interpret WCA(j). If the interpretation of WCA(j) is wrong or incorrect, the terminal is unable to receive PDCCH(i) correctly.

Second Operational Consideration

Figure 11:
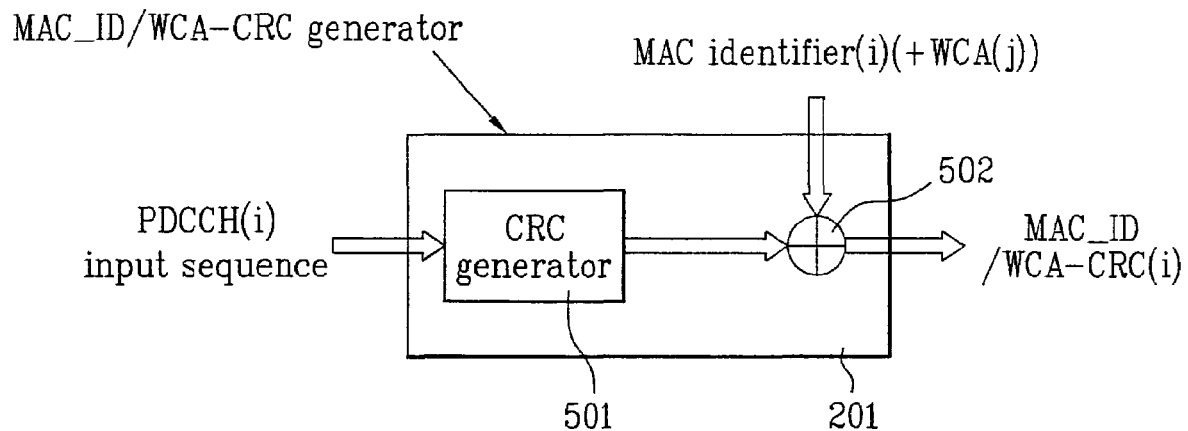
FIG. 11 and FIG. 12 illustrate block diagrams of the error detection code addition block in accordance with a preferred embodiment.

In the first operational consideration, assuming that j is (i−1), a terminal should recognize MAC identifier(i) and WCA(i−1) in order to receive the PDCCH(i). In order to receive the PDCCH(i), PDCCH(j−1) needs to be correctly received in order to interpret WCA(i−1). However, a value of WCA(0) should be determined previously, e.g., WCA (0)=$(00000)_2$. FIG. 11 illustrates a more detailed block diagram of the error detection code addition block of FIG. 7 in accordance with another preferred embodiment. Referring to FIG. 11, a MAC_ID/WCA-CRC generator 201 according to the present invention includes a CRC generator 501 generating a general CRC code and a modulo operator 502. The CRC generator 501 uses PDCCH(i) input sequence of x-bits to generate a general CRC code of M-bit length. The modulo operator 502 carries out modulo operation on the general CRC code and {MAC identifier(i) of S bits+WCA(j) of Y bits}, where i≠j, so as to generate MAC_ID/WCA-CRC(i) of M bits. If (S+Y)<M, '0's or '1's are padded in front or rear of the sequence comprising the {MAC identifier(i)+WCA(j)}, prior to the modulo 2 operation being carried out. In FIG. 11, WCA(j) and MAC_ID(i) are selectively used to generate the MAC_ID/WCA-CRC code. That is, MAC_ID/WCA-CRC generator uses both or either of them.

Figure 12:
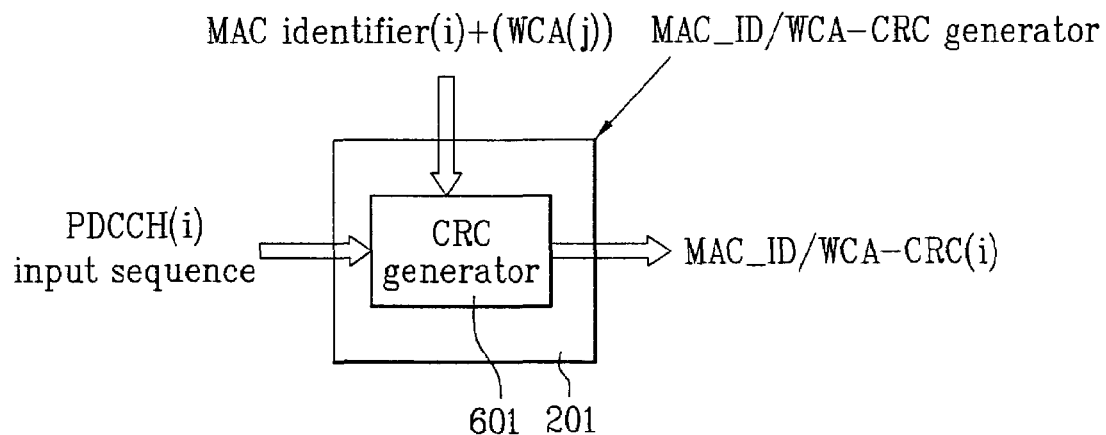

FIG. 12 illustrates a more block diagram of the error detection code addition block in FIG. 7 in accordance with another preferred embodiment. Referring to FIG. 12, a CRC generator 601 included in a MAC_ID/WCA-CRC generator 201 initializes values of its transition registers using {MAC identifier(i)+WCA(j)}, where ij. The CRC generator 601 having the initialized transition registers uses the PDCCH(i) input sequence of x-bit length as an input so as to generate MAC_ID/WCA-CRC(i) of M-bits length. If a length of the {MAC identifier(i)+WCA(j), ij} is shorter than that for initializing the values of the transition registers of the CRC generator 601, '0's or '1's amounting to the necessary number are padded in front or rear of the sequence constituted with the {MAC identifier(i)+WCA(j), ij} and initialization is then carried out.

Figure 13:
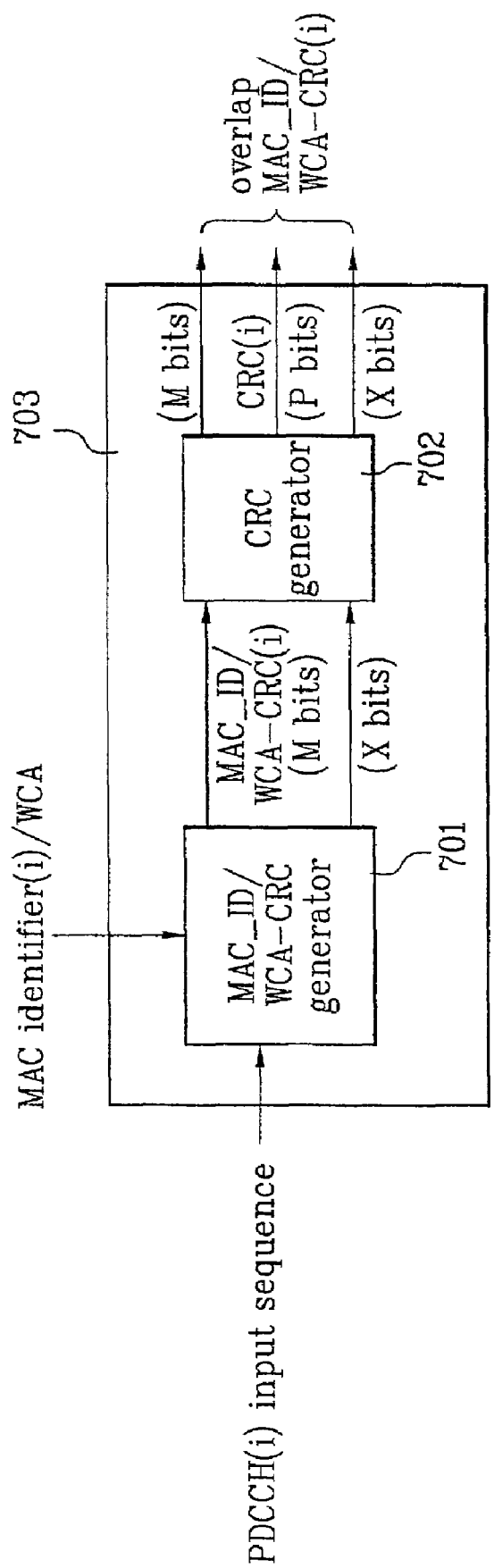
FIG. 13 illustrates a detailed block diagram of the error detection code addition block in accordance with a preferred embodiment.

FIG. 13 illustrates a detailed block diagram of the error detection code addition block of FIG. 5A in accordance with another preferred embodiment. The error detection code addition block serves as an overlap MAC_ID/WCA-CRC generator 703 to generate an overlap MAC_ID/WCA-CRC code. The overlap MAC_ID/WCA-CRC generator 703 includes a MAC_ID/WCA-CRC generator 701 and a CRC generator 702. The CRC generator 702 includes transition registers. The MAC_ID/WCA-CRC generator 701 may comprise any one of the preferred embodiments shown in FIGS. 8, 9, 11 and 12.

The MAC_ID/WCA-CRC generator 701 uses the PDCCH (i) input sequence of x-bits, including WCA(j) of Y-bits and a MAC identifier(i) of S-bits from its inputs so as to generate MAC_ID/WCA-CRC(i) of M-bits. The MAC identifier(i) is allocated to a terminal or a user intended to receive the information on the PDCCH(i).

The CRC generator 702 uses PDCCH(i), and MAC_ID/WCA-CRC(i) sequence to generate CRC(i) of P bits. The generated CRC(i) and MAC_ID/WCA-CRC(i) are connected to each other to generate the overlap MAC_ID/WCA-CRC(i), which is in inputted to a following stage in the transmission chain structure of FIG. 5A or FIG. 5B.

Figure 14:
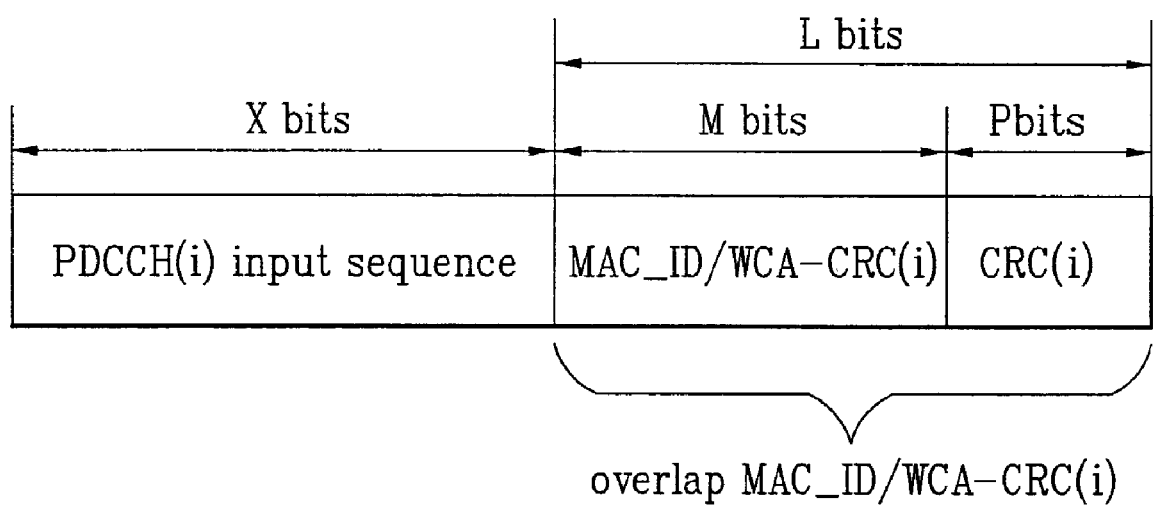
FIG. 14 illustrates a diagram of an output result of the error detection code addition block shown in FIG. 13 in accordance with a preferred embodiment.

FIG. 14 illustrates a diagram of an output result of the error detection code addition block of FIG. 13. The arrangement order of the MAC_ID/WCA-CRC(i) and PDCCH(i) input sequence can be reversed. Since, the MAC identifier(i) and WCA(j) are used for generating MAC_ID/WCA-CRC(i), these fields need not be transmitted to a receiving end, and the overlap MAC_ID/WCA-CRC(i) and PDCCH(i) sequence are transmitted to the receiving end. If the WCA(j) is not used, this embodiment is quite similar or the same as the embodiment of the double CRC.

First Operational Consideration of FIG. 13

When N number of PDCH(i)s and N number of PDCCH (i)s are used, a terminal judges whether PDDCH(i) is received normally or not through a series of the following processes using the overlap MAC_ID/WCA-CRC(i).

The terminal checks CRC(i) in the overlap MAC_ID/WCA-CRC(i) to judge whether PDDCH(i) is received correctly or not. If a transmission length of PDCCH(i) is variable, the terminal recognizes the transmission length of PDCCH(i) by checking the CRC(i). Having determined that the PDDCH(i) is correctly received, the terminal judges whether PDCCH(i) is its control channel or not using the MAC_ID/WCA-CRC(i) in the overlap MAC_ID/WCA-CRC (i) as well as judging again as to whether PDCCH(i) is correctly received.

In this case, in order to check the MAC_ID/WCA-CRC(i), the terminal needs to know the MAC identifier(i) independently or both the MAC identifier(i) and WCA(j). In case that the terminal needs to know both the MAC identifier(i) and WCA(j), PDCCH(j) needs to be correctly received so that WCA(j) can be interpreted in order to receive PDCCH(i). If the interpretation of WCA(j) is wrong, an error will be detected when MAC_ID/WCA-CRC(i) is checked.

Second Operational Consideration of FIG. 13

If one or more PDCCH(i)'s are simultaneously transmitted, the PDCCH(i)'s transmitted simultaneously have the same transmission length, and a specific PDCCH(K) and the rest of the PDCCH(i)s (except the specific PDCCH(k)) can have the overlap MAC_ID/WCA-CRC(i)s of different structures, respectively.

Assuming that the specific PDCCH(K) is PDCCH(1), the process goes as follows. The PDDCH(1) generates the overlap MAC_ID/WCA-CRC(1) through the same process of FIG. 13, and the terminal checks as to whether an error of PDDCH(1) has occurred or not through the first operational consideration.

The PDCCH(i)s, except PDCCH(1) excludes the generation process of CRC(i) of FIG. 13, and an overlap MAC_ID/WCA-CRC(i) of L bits is generated by the MAC_ID/WCA-CRC generator. The terminal checks whether errors of the PDCCH(i)s have occurred or not through the first operational consideration. Hence, the check for CRC(i) is not carried out.

Third Operational Consideration of FIG. 13

In the first and second operational considerations, assuming that j is (i−1), a terminal should recognize MAC identifier (i) and WCA(i−1) in order to receive PDCCH(i). In order to receive PDCCH(i), PDCCH(j−1) needs to be correctly received so that WCA(i−1) can be correctly interpreted. Hence, a value of WCA(0) needs to be previously determined. For example, it may be that WCA(0)=(00000)$_2$.

Accordingly, the preferred embodiment enables operation in CDM/TDM mode, thereby reducing waste of available sources. Moreover, the present invention uses double CRC or the MAC_ID/WCA-CRC code, thereby reducing the number of bits of the PDCCH and improving the error detection capability of PDCCH(i).

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for a receiver to receive a massage from a transmitter over a prescribed channel, the method comprising:
   receiving the message containing first information, a first error indication code masked by a terminal identifier and a second error indication code calculated based on the first information and the masked first error indication code at the transmitter;
   using the second error indication code, performing a cyclic redundancy check on the first information and the masked first error indication code; and
   using the first error indication code, performing a cyclic redundancy check on the first information,
   wherein performing the cyclic redundancy check on the first information includes unmasking the first error indication code masked by the terminal identifier.

2. The method of claim 1, wherein the prescribed channel is a packet data control channel.

3. The method of claim 2, wherein the terminal identifier is a Medium Access Control (MAC) identifier.

4. The method of any of claim 1 to 3, wherein the method is carried out at a terminal identified by the terminal identifier.

* * * * *